(12) United States Patent
Nii et al.

(10) Patent No.: US 6,504,788 B1
(45) Date of Patent: Jan. 7, 2003

(54) SEMICONDUCTOR MEMORY WITH IMPROVED SOFT ERROR RESISTANCE

(75) Inventors: Koji Nii, Tokyo (JP); Shoji Okuda, Hyogo (JP)

(73) Assignee: Mitsubishi Denki Kabushiki Kaisha, Chiyoda-Ku (JP)

( * ) Notice: Subject to any disclaimer, the term of this patent is extended or adjusted under 35 U.S.C. 154(b) by 0 days.

(21) Appl. No.: 10/141,184

(22) Filed: May 9, 2002

(30) Foreign Application Priority Data

Jul. 12, 2001 (JP) ........................................ 2001-212483

(51) Int. Cl.$^7$ ............................. G11C 8/00; G11C 11/00
(52) U.S. Cl. ................... 365/230.05; 365/154; 365/156
(58) Field of Search ........................... 365/230.05, 154, 365/156

(56) References Cited

U.S. PATENT DOCUMENTS

| | | | |
|---|---|---|---|
| 5,959,931 A | * 9/1999 | Ueda | 365/230.05 |
| 6,222,777 B1 | * 4/2001 | Khieu | 365/230.05 |
| 6,262,932 B1 | * 7/2001 | Nguyen | 365/230.05 |
| 6,430,088 B1 | * 8/2002 | Plants | 365/230.05 |

FOREIGN PATENT DOCUMENTS

| | | |
|---|---|---|
| JP | 5-307887 | 11/1993 |
| JP | 7-263577 | 10/1995 |

OTHER PUBLICATIONS

U.S. Patent Application No. 09/883,354, filed Jun. 19, 2001.

\* cited by examiner

*Primary Examiner*—Trong Phan
(74) *Attorney, Agent, or Firm*—Burns, Doane, Swecker & Mathis, LLP

(57) ABSTRACT

A semiconductor memory includes a first inverter, a second inverter and a read circuit. The first inverter has its input terminal connected to a first memory node and its output terminal connected to a second memory node. The second inverter is connected in anti-parallel with the first inverter, that is, has its input terminal connected to the second memory node and its output terminal connected to the first memory node. The read circuit includes a first transistor having its gate connected to the first memory node, a second transistor having its gate connected to the second memory node, and a third transistor for connecting the drain of the first transistor and that of the second transistor to a read bit line. The semiconductor memory can improve its soft error resistance without increasing the number of steps of the manufacturing process.

10 Claims, 4 Drawing Sheets

SEMICONDUCTOR MEMORY WITH IMPROVED SOFT ERROR RESISTANCE

BACKGROUND OF THE INVENTION

1. Field of the Invention

The present invention relates to a semiconductor memory capable of improving soft error resistance.

2. Description of Related Art

FIG. 5 is a circuit diagram showing a configuration of a memory core of an SRAM as an example of a conventional semiconductor memory. In this figure, reference symbols INV11 and INV12 each designate an inverter, and a and b each designate a memory node. FIG. 6 is a circuit diagram showing a configuration in which the inverters INV11 and INV12 of FIG. 5 are constructed by MOS transistors. In FIG. 6, the reference symbol PM11 designates a PMOS transistor, NM11 designates an nMOS transistor, IN designates an input terminal and OUT designates an output terminal.

Next, the operation of the conventional semiconductor memory will be described.

In FIG. 6, when the input terminal IN is placed at the logically high level (that is, at a voltage VDD), the pMOS transistor PM11 is brought out of conduction and the nMOS transistor NM11 is brought into conduction. Thus, the output terminal OUT is connected to the ground GND by the nMOS transistor NM11, thereby being placed at the logically low level. On the contrary, when the input terminal IN is placed at the logically low level (that is, at the ground GND), the pMOS transistor PM11 is brought into conduction and the nMOS transistor NM11 is brought out of conduction. Therefore, the output terminal OUT is connected to the supply voltage VDD via the pMOS transistor PM11, thereby being placed at the logically high level. Thus, the input and output logical levels of the inverters have a complementary relation.

In FIG. 5, since the memory nodes a and b have the complementary relation, when the memory node a is placed at the logically high level, the other memory node b is maintained at the logically low level. On the contrary, when the memory node a is placed at the logically low level, the other memory node b is maintained at the logically high level. Thus, the two memory nodes a and b maintain the opposite levels, thereby providing the two stable states to hold the memory data.

Recently, multi-processor technique has been introduced as one of means to implement high speed computers, and it requires that the multiple CPUs share one common memory area. In other words, the need intensifies for the multi-port memory that allows access to a single memory via multiple ports.

FIG. 7 is a circuit diagram showing a configuration of a conventional two-port RAM that utilizes two inverters INV11 and INV12 as shown in FIG. 5 whose memory nodes a and b are complementary to each other, and that is accessible from two CPUs. In this figure, the reference symbol NA11 designates an nMOS transistor connected to the memory node a; NA12 designates an nMOS transistor connected to the memory node b; INV13 designates an inverter whose input is connected to the memory node a; NR11 designates an nMOS transistor connected to the output of the inverter INV13; WL11 designates a word line connected to the gates of the nMOS transistors NA11 and NA12; BL11 and BL12 designate bit lines connected to the nMOS transistors NA11 and NA12; RL11 designates a read control line connected to the gate of the nMOS transistor NR11; and RBL11 designates a read bit line connected to the nMOS transistor NR11.

Next, the operation of the conventional two-port RAM will be described.

When the word line WL11 is placed at the high level, the nMOS transistors NA11 and NA12 are both brought into conduction. Accordingly, the memory node a is connected to the bit line BL11 and the memory node b is connected to the bit line BL12. In this case, when the read control line RL11 is placed at the high level, the memory data at the memory node a is supplied to the read bit line RBL11 via the inverter INV13.

The semiconductor memories such as SRAM and multi-port RAM composed of the CMOS inverters are very stable, and have no problem of noise as long as their memory capacity and chip size are in a certain range.

With the foregoing configuration, the conventional semiconductor memory has a problem of causing a soft error when increasing a memory capacity with restricting a chip size. One of external factors causing the soft error in the semiconductor memory, there is a soft error brought about by α rays emanating from a trace quantity of radioactive substance contained in the package. When the α rays enter the memory cell, they generate many electron-hole pairs that can cause data changes (data inversion) in the memory data.

The soft error is apt to occur as the node capacity of the memory node reduces with scale down. In FIG. 7, for example, since the memory node a is connected to the inverter INV13, its node capacity is greater than the node capacity of the memory node b. To increase the memory capacity without increasing the size of the two-port RAM, it is necessary to make the size of the MOS transistor extremely fine. As a result, the node capacity of the memory node b is further reduced, thereby increasing the probability of bringing about the soft error.

As a measure taken to prevent the soft error, a proposition is put forward for preventing the data inversion of the memory data, which is caused by the electron-hole pairs generated by the a rays, by increasing the node capacity of the memory node. For example, Japanese patent application laid-open No. 9-270469/1997 discloses a technique of increasing the node capacity of the memory node by forming a capacitor between the memory node and the semiconductor substrate by interposing a thin active region between them.

The method, however, offers a new problem of requiring an extra manufacturing process of forming the capacitors, thereby increasing its cost. In addition, an increase in the number of process steps can reduce its yield.

SUMMARY OF THE INVENTION

The present invention is implemented to solve the foregoing problem. It is therefore an object of the present invention to provide a semiconductor memory capable of improving the soft error resistance without increasing the number of steps of the manufacturing process.

According to one, aspect of the present invention, there is provided a semiconductor memory comprising: a first inverter having its input terminal connected to a first memory node that is connected to a first bit line when a first word line is active, and its output terminal connected to a second memory node that is connected to a second bit line when a second word line is active; a second inverter having its input terminal connected to the second memory node, and its output terminal connected to the first memory node; and a first read circuit having its input terminals connected to the first memory node and the second memory node, and its output terminal connected to a read bit line, wherein the first read circuit includes: a first MOS transistor having its gate connected to the first memory node; a second MOS transistor having its gate connected to the second memory node, and its drain connected to the drain of the first MOS transistor; and a third MOS transistor having its source and drain brought into conduction when a read control line connected to its gate is active, thereby connecting the read bit line to the drains of the first MOS transistor and the second MOS transistor.

Here, the first MOS transistor may consist of an nMOS transistor having its source grounded, and the second MOS transistor may consist of a pMOS transistor having its source grounded.

The third MOS transistor may consist of an nMOS transistor.

The first MOS transistor may consist of an nMOS transistor having its source connected to a supply voltage, and the second MOS transistor may consist of a pMOS transistor having its source connected to the supply voltage.

The third MOS transistor may consist of a pMOS transistor.

The semiconductor memory may further comprise at least one second read circuit that has a same configuration as the first read circuit, and has its input terminals connected to the first memory node and the second memory node, and its output terminal connected to a second read bit line, wherein a third MOS transistor of the second read circuit has its source and drain brought into conduction when a read control line connected to its gate is active, thereby connecting the second read bit line to the drains of a first MOS transistor and a second MOS transistor of the second read circuit.

Each first MOS transistor may consist of an nMOS transistor having its source grounded, and each second MOS transistor may consist of a pMOS transistor having its source grounded.

Each third MOS transistor may consist of an nMOS transistor.

Each first MOS transistor may consist of an nMOS transistor having its source connected to a supply voltage, and each second MOS transistor may consist of a pMOS transistor having its source connected to the supply voltage.

Each third MOS transistor may consist of a PMOS transistor.

DETAILED DESCRIPTION OF THE PREFERRED EMBODIMENTS

The invention will now be described with reference to the accompanying drawings.

EMBODIMENT 1

Figure 1:
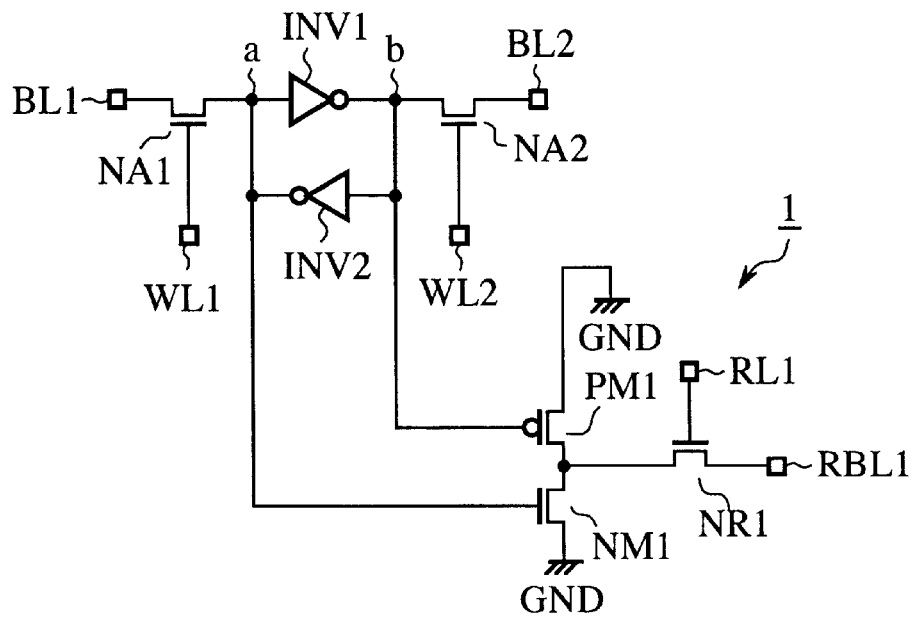
FIG. 1 is a circuit diagram showing a configuration of an embodiment 1 of the semiconductor memory in accordance with the present invention.

FIG. 1 is a circuit diagram showing a configuration of an embodiment 1 of the semiconductor memory in accordance with the present invention. In this figure, reference symbols INV1 and INV2 designate inverters which are complementary to each other; a and b each designate a memory node; NA1 designates an nMOS transistor connected to the memory node a; NA2 designates an nMOS transistor connected to the memory node b; NM1 designates an nMOS transistor having its gate connected to the memory node a, and its source connected to the ground GND; PM1 designates a pMOS transistor having its gate to the memory node 1, its source connected to the ground GND and its drain connected to the drain of the nMOS transistor NM1; NR1 designates an nMOS transistor having its source connected to the drains of the nMOS transistor NM1 and the pMOS transistor PM1; WL1 and WL2 designate word lines connected to the gates of the nMOS transistors NA1 and NA2, respectively; BL1 and BL2 designate bit lines connected to the nMOS transistors NA1 and NA2, respectively; RL1 designates a read control line connected to the gate of the nMOS transistor NR1; and RBL1 designates a read bit line connected to the nMOS transistor NR1. The reference numeral 1 designates a read circuit comprising the nMOS transistor NM1, pMOS transistor PM1 and nMOS transistor NR1.

Next, the operation of the present embodiment 1 will be described.

When the word lines WL1 and WL2 are both placed at the high level (active state), the nMOS transistors NA1 and NA2 are both brought into conduction, thereby connecting the memory node a to the bit line BL1, and the memory node b to the bit line BL2. When the memory node a is at the logically high level (therefore, the memory node J is at the logically low level), both the nMOS transistor NM1 and the pMOS transistor PM1 conduct, thereby connecting both their drains to the ground GND. Thus, when the read control line RL1 is placed at the high level (active state) while the read bit line RBL1 is precharged to the high level, the nMOS transistor NR1 is brought into conduction. As a result, the charges on the read bit line RBL1 precharged to the high level are discharged, bringing the read bit line RBL1 to the logically low level.

On the contrary, when the memory node a is at the logically low level (therefore, the memory node L is at the logically high level), both the nMOS transistor NM1 and the pMOS transistor PM1 are out of conduction. Thus, even when the read control line RL1 is placed at the high level and the nMOS transistor NR1 is brought into conduction while the read bit line RBL1 is precharged to the high level, the charges on the read bit line RBL1 precharged to the high level are not discharged, thereby maintaining the read bit line RBL1 at the logically high level.

Thus, the state of the memory data held at the memory nodes a and b does not change even when the read circuit 1 including the nMOS transistor NM1, pMOS transistor PM1 and nMOS transistor NR1 reads the memory data at the memory nodes a and b. In addition, since the gate of the nMOS transistor NM1 is added to the memory node a as a capacitor, and the gate of the pMOS transistor PM1 is added to the memory node b as a capacitor, the node capacity of the memory nodes a and b is increased as compared with that of the conventional semiconductor memory. Therefore, the data changes (data inversion) because of the external factors such as a rays are becoming increasingly hard to occur, thereby improving the soft error resistance. In this case, the number of steps of the manufacturing process does not increase. In addition, since the pMOS transistor PM1 promotes the discharge of the read bit line RBL1 which is precharged to the high level, its transition from the logically high level to the low level is accelerated.

As described above, the present embodiment 1 offers an advantage of being able to improve the soft error resistance without increasing the number of steps of manufacturing process, and to accelerate the operation of the circuit as compared with that of the conventional semiconductor memory.

EMBODIMENT 2

Figure 2:
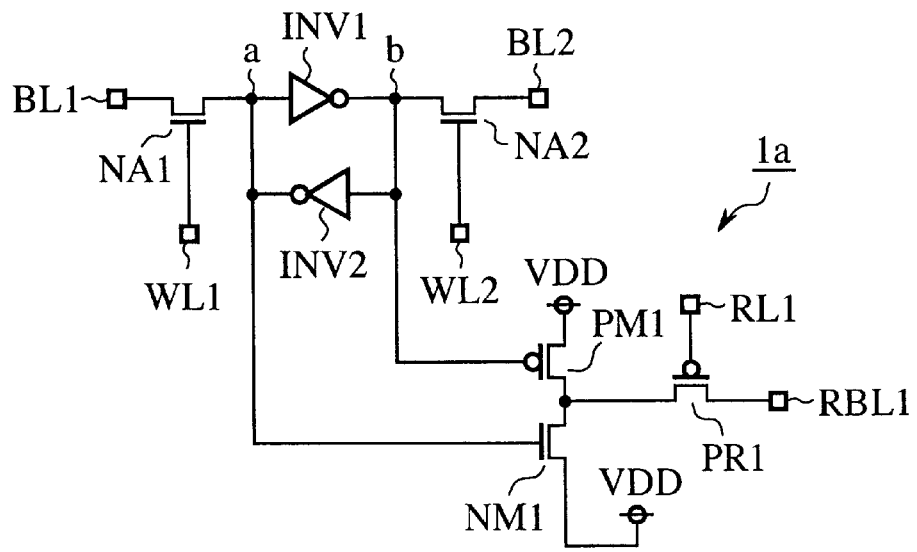
FIG. 2 is a circuit diagram showing a configuration of an embodiment 2 of the semiconductor memory in accordance with the present invention.

FIG. 2 is a circuit diagram showing a configuration of an embodiment 2 of the semiconductor memory in accordance with the present invention. In this figure, the same reference symbols designate the same components as those of the embodiment 1 in FIG. 1, and the description thereof is omitted here. Thus, only the components different from those of the embodiment 1 will be described. In FIG. 2, the reference numeral 1a designates a read circuit comprising the nMOS transistor NM1, pMOS transistor PM1 and pMOS transistor PR1. In the read circuit 1a, the nMOS transistor NM1 and the pMOS transistor PM1 have their sources connected to the supply voltage VDD, that is, to the fixed potential at the logically high level. The reference symbol PR1 designates the pMOS transistor connected across the read bit line RBL1 and the drains of the nMOS transistor NM1 and pMOS transistor PM1.

Next, the operation of the present embodiment 2 will be described.

When the word lines WL1 and WL2 are both placed at the high level (active state), the nMOS transistors NA1 and NA2 are both brought into conduction, thereby connecting the memory node a to the bit line BL1, and the memory node b to the bit line BL2. When the memory node a is at the logically high level (therefore, the memory node b is at the logically low level), both the nMOS transistor NM1 and the pMOS transistor PM1 conduct, thereby connecting both their drains to the supply voltage VDD. Thus, when the read control line RL1 is placed at the low level (active state) while the read bit line RBL1 is precharged to the low level, the pMOS transistor PR1 is brought into conduction. As a result, the read bit line RBL1 precharged to the low level is charged to the logically high level by the supply voltage VDD.

On the contrary, when the memory node a is at the logically low level (therefore, the memory node b is at the logically high level), both the nMOS transistor NM1 and the pMOS transistor PM1 are out of conduction. Thus, even when the read control line RL1 is placed at the low level and the pMOS transistor PR1 is brought into conduction while the read bit line RBL1 is precharged to the low level, the read bit line RBL1 precharged to the low level keeps its logically low level.

Thus, the state of the memory data held at the memory nodes a and b does not change even when the read circuit 1a composed of the nMOS transistor NM1, pMOS transistor PM1 and pMOS transistor PR1 reads the memory data at the memory nodes a and b. In addition, since the gate of the nMOS transistor NM1 is added to the memory node a as a capacitor, and the gate of the pMOS transistor PM1 is added to the memory node b as a capacitor, the node capacity of the memory nodes a and b is increased as compared with that of the conventional semiconductor memory. Therefore, the data changes (data inversion) because of the external factors such as a rays are becoming increasingly hard to occur, thereby improving the soft error resistance. In this case, the number of steps of the manufacturing process does not increase. In addition, since the pMOS transistor PM1 promotes the charge by the supply voltage VDD of the read bit line RBL1 which is precharged to the low level, its transition from the logically low level to the high level is accelerated.

As described above, just as the foregoing embodiment 1, the present embodiment 2 offers an advantage of being able to improve the soft error resistance without increasing the number of steps of manufacturing process, and to accelerate the operation of the circuit as compared with that of the conventional semiconductor memory.

EMBODIMENT 3

Figure 3:
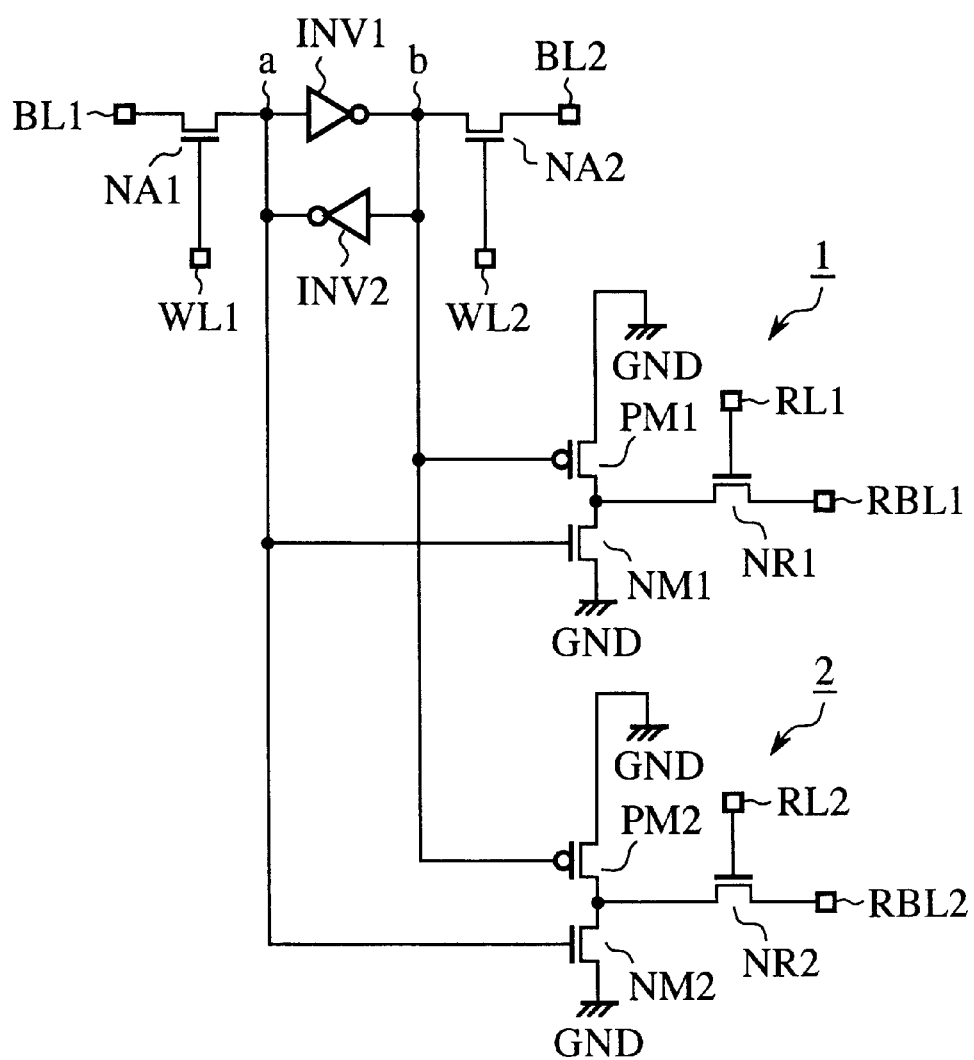
FIG. 3 is a circuit diagram showing a configuration of an embodiment 3 of the semiconductor memory in accordance with the present invention.

FIG. 3 is a circuit diagram showing a configuration of an embodiment 3 of the semiconductor memory in accordance with the present invention. In this figure, the same reference symbols designate the same components as those of the embodiment 1 in FIG. 1, and the description thereof is omitted here. Thus, only the components different from those of the embodiment 1 will be described.

In FIG. 3, the reference numeral 2 designates a second read circuit comprising a pMOS transistor PM2, an nMOS transistor NM2 and an nMOS transistor NR2. In the second read circuit 2, the nMOS transistor NM2 has its gate connected to the memory node a, and its source connected to the ground GND. The pMOS transistor PM2 has its gate connected to the memory node 2, its source connected to the ground GND and its drain connected to the drain of the nMOS transistor NM2. The nMOS transistor NR2 has its source connected to the drains of the nMOS transistor NM2 and the pMOS transistor PM2, its gate connected to a read control line RL2, and its drain connected to a read bit line RBL2.

In other words, in parallel to the read circuit 1 (first read circuit) of the foregoing embodiment 1 including the pMOS transistor PM1, nMOS transistor NM1 and nMOS transistor NR1, the present embodiment 3 comprises the second read circuit 2 including the PMOS transistor PM2, nMOS transistor NM2 and nMOS transistor NR2. Accordingly, the present embodiment 3 of the semiconductor memory has two read ports.

Since the operation of the second read circuit 2 is the same as that of the first read circuit 1 of the embodiment 1, the description thereof is omitted here.

The state of the memory data held at the memory nodes a and b does not change even when the first read circuit 1 and the second read circuit 2 read the memory data at the memory nodes a and b. In addition, since the gates of the nMOS transistors NM1 and NM2 are added to the memory node a as a capacitor, and the gates of the pMOS transistors PM1 and PM2 are added to the memory node b as a capacitor, the node capacity of the memory nodes a and b becomes greater than that of the embodiment 1 of the semiconductor memory. Therefore, the data changes (data inversion) because of the external factors such as α rays are becoming increasingly hard to occur, thereby further improving the soft error resistance. In this case, the number of steps of the manufacturing process does not increase. In addition, since the PMOS transistors PM1 and PM2 promote the discharge of the read bit lines RBL1 and RBL2 which are precharged to the high level, their transition from the logically high level to the low level is accelerated.

Although the semiconductor memory with the two read ports is described in the present embodiment 3, a semiconductor memory with three or more read ports also has little effect on the memory data at the memory node a and b. In addition, since the node capacity of the memory nodes a and b further increases, the data changes (data inversion) because of the external factors such as α rays are becoming scarcely to occur, thereby improving the soft error resistance to a very high level. Moreover, the semiconductor memory with the multiple read circuits can be produced through the same the manufacturing process as the manufacturing process of the semiconductor memory with a single read circuit.

As described above, in spite of the fact that it has the multiple read ports, the present embodiment 3 offers an advantage of being able to improve the soft error resistance without increasing the number of steps of manufacturing process, and to accelerate the operation of the circuit as compared with that of the conventional semiconductor memory.

EMBODIMENT 4

Figure 4:
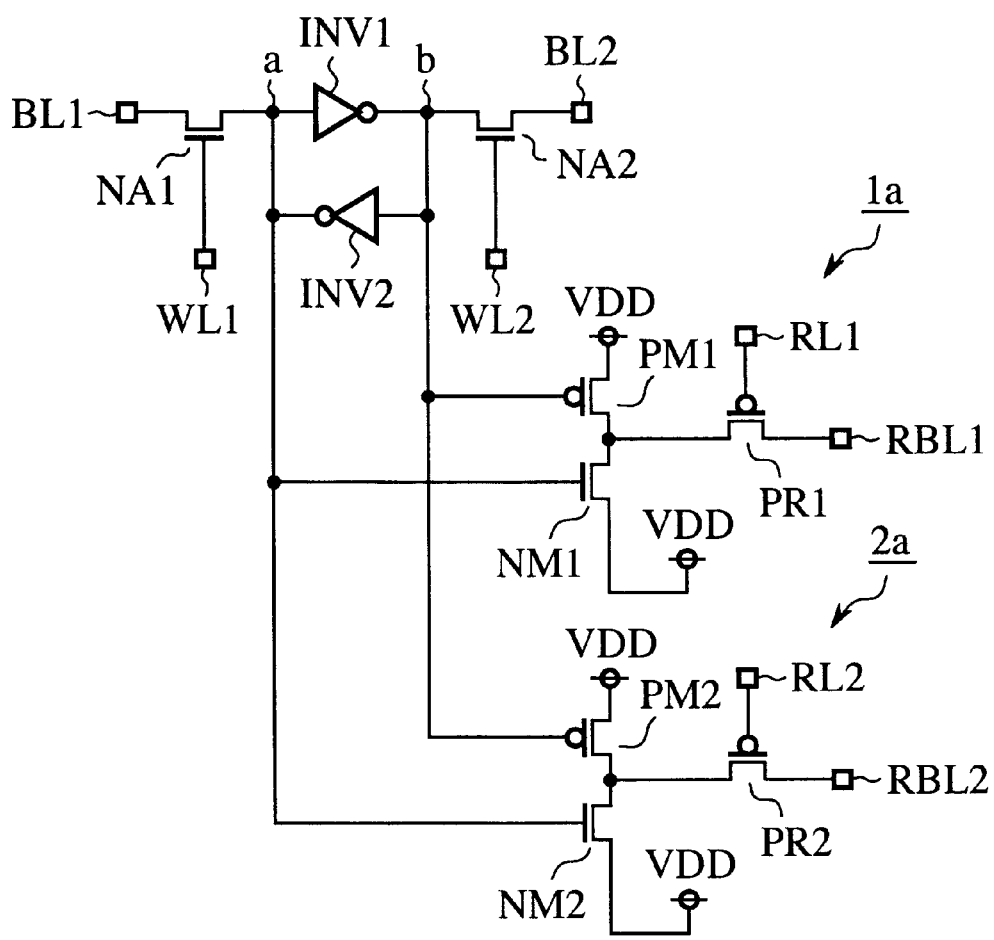
FIG. 4 is a circuit diagram showing a configuration of an embodiment 4 of the semiconductor memory in accordance with the present invention.
Figure 5:
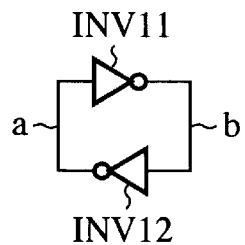
FIG. 5 is a circuit diagram showing two inverters in a conventional semiconductor memory.
Figure 6:
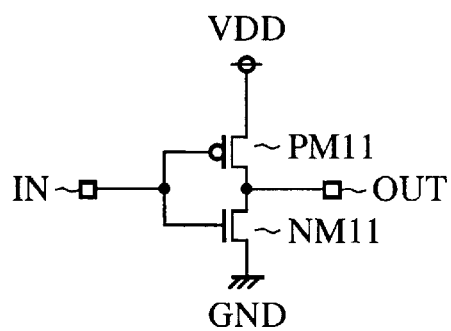
FIG. 6 is a circuit diagram showing the internal transistors of each inverter of FIG. 5.
Figure 7:
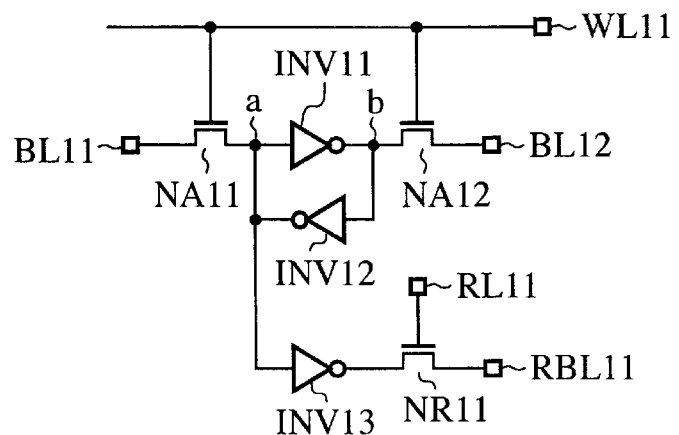
FIG. 7 is a circuit diagram showing a configuration of another conventional semiconductor memory.

FIG. 4 is a circuit diagram showing a configuration of an embodiment 4 of the semiconductor memory in accordance with the present invention. In this figure, the same reference symbols designate the same components as those of the embodiment 2 in FIG. 2, and the description thereof is omitted here. Thus, only the components different from those of the embodiment 2 will be described.

In FIG. 4, the reference numeral 2a designates a second read circuit comprising a pMOS transistor PM2, an nMOS transistor NM2 and a pMOS transistor PR2. In the second read circuit 2a, the nMOS transistor NM2 has its gate connected to the memory node a, and its source connected to the supply voltage VDD. The pMOS transistor PM2 has its gate connected to the memory node b, its source connected to the supply voltage VDD and its drain connected to the drain of the nMOS transistor NM2. The pMOS transistor PR2 has its source connected to the drains of the nMOS transistor NM2 and the pMOS transistor PM2, its gate connected to a read control line RL2, and its drain connected to a read bit line RBL2.

In other words, in parallel to the read circuit 1a (first read circuit) of the foregoing embodiment 2 including the PMOS transistor PM1, nMOS transistor NM1 and pMOS transistor PR1, the present embodiment 4 comprises the second read circuit 2a including the pMOS transistor PM2, nMOS transistor NM2 and pMOS transistor PR2. Accordingly, the present embodiment 4 of the semiconductor memory has two read ports.

Since the operation of the second read circuit 2a is the same as that of the first read circuit 1a of the embodiment 2, the description thereof is omitted here.

The state of the memory data held at the memory nodes a and b does not change even when the first read circuit 1a and the second read circuit 2a read the memory data at the memory nodes a and b. In addition, since the gates of the nMOS transistors NM1 and NM2 are added to the memory node a as a capacitor, and the gates of the pMOS transistors PM1 and PM2 are added to the memory node b as a capacitor, the node capacity of the memory nodes a and b becomes greater than that of the embodiment 2 of the semiconductor memory. Therefore, the data changes (data inversion) because of the external factors such as α rays are becoming increasingly hard to occur, thereby further improving the soft error resistance. In this case, the number of steps of the manufacturing process does not increase. In addition, since the pMOS transistors PM1 and PM2 promote the charge by the supply voltage VDD of the read bit lines RBL1 and RBL2 which are precharged to the low level, their transition from the logically low level to the high level is accelerated.

Although the semiconductor memory with the two read ports is described in the present embodiment 4, a semiconductor memory with three or more read ports also has little effect on the memory data at the memory node a and b. In addition, since the node capacity of the memory nodes a and b further increases, the data changes (data inversion) because of the external factors such as α rays are becoming scarcely to occur, thereby improving the soft error resistance to a very high level. Moreover, the semiconductor memory with the multiple read circuits can be produced through the same the manufacturing process as the manufacturing process of the semiconductor memory with a single read circuit.

As described above, in spite of the fact that it has the multiple read ports, the present embodiment 4 offers an advantage of being able to improve the soft error resistance without increasing the number of steps of manufacturing process, and to accelerate the operation of the circuit as compared with that of the conventional semiconductor memory.

What is claimed is:

1. A semiconductor memory comprising:
   a first inverter having its input terminal connected to a first memory node that is connected to a first bit line when a first word line is active, and its output terminal connected to a second memory node that is connected to a second bit line when a second word line is active;
   a second inverter having its input terminal connected to the second memory node, and its output terminal connected to the first memory node; and
   a first read circuit having its input terminals connected to the first memory node and the second memory node, and its output terminal connected to a read bit line, wherein
   said first read circuit includes:
      a first MOS transistor having its gate connected to the first memory node;
      a second MOS transistor having its gate connected to the second memory node, and its drain connected to the drain of said first MOS transistor; and
      a third MOS transistor having its source and drain brought into conduction when a read control line connected to its gate is active, thereby connecting the read bit line to the drains of said first MOS transistor and said second MOS transistor.

2. The semiconductor memory according to claim 1, wherein said first MOS transistor consists of an nMOS transistor having its source grounded, and said second MOS transistor consists of a pMOS transistor having its source grounded.

3. The semiconductor memory according to claim 2, wherein said third MOS transistor consists of an nMOS transistor.

4. The semiconductor memory according to claim 1, wherein said first MOS transistor consists of an nMOS transistor having its source connected to a supply voltage, and said second MOS transistor consists of a pMOS transistor having its source connected to the supply voltage.

5. The semiconductor memory according to claim 4, wherein said third MOS transistor consists of a pMOS transistor.

6. The semiconductor memory according to claim 1, further comprising at least one second read circuit that has a same configuration as said first read circuit, and has its input terminals connected to the first memory node and the second memory node, and its output terminal connected to a second read bit line, wherein a third MOS transistor of said second read circuit has its source and drain brought into conduction when a read control line connected to its gate is active, thereby connecting the second read bit line to the drains of a first MOS transistor and a second MOS transistor of said second read circuit.

7. The semiconductor memory according to claim 6, wherein each first MOS transistor consists of an nMOS transistor having its source grounded, and each second MOS transistor consists of a pMOS transistor having its source grounded.

8. The semiconductor memory according to claim 7, wherein each third MOS transistor consists of an nMOS transistor.

9. The semiconductor memory according to claim 6, wherein each first MOS transistor consists of an nMOS transistor having its source connected to a supply voltage, and each second MOS transistor consists of a pMOS transistor having its source connected to the supply voltage.

10. The semiconductor memory according to claim 9, wherein each third MOS transistor consists of a pMOS transistor.

* * * * *